United States Patent [19]
Khanna

[11] Patent Number: 4,755,772
[45] Date of Patent: Jul. 5, 1988

[54] SWITCHABLE MICROWAVE OSCILLATOR

[75] Inventor: Amarpal S. Khanna, San Jose, Calif.

[73] Assignee: Avantek, Inc., Santa Clara, Calif.

[21] Appl. No.: 58,589

[22] Filed: Jun. 5, 1987

[51] Int. Cl.⁴ .......................... H03B 5/12; H03B 5/18; H03C 1/14
[52] U.S. Cl. .................. 331/109; 331/117 R; 331/117 FE; 331/117 D; 331/173; 331/182; 332/31 T
[58] Field of Search ............. 331/109, 117 R, 117 FE, 331/117 D, 173, 182, 177 V; 332/31 T; 375/66

[56] References Cited

U.S. PATENT DOCUMENTS

| | | | |
|---|---|---|---|
| 2,974,293 | 3/1961 | Fryklund | 331/149 |
| 3,093,809 | 6/1963 | Watlington | 340/15 |
| 3,225,536 | 12/1965 | Reich | 58/23 |
| 3,304,517 | 2/1967 | Yamanaka et al. | 331/112 |
| 3,307,118 | 2/1967 | Svec | 331/49 |
| 3,409,842 | 11/1968 | Embling et al. | 331/65 |
| 3,535,652 | 10/1970 | Minks | 331/112 |
| 3,651,428 | 3/1972 | Brander | 331/173 |
| 3,679,991 | 7/1972 | Wilwerding | 331/62 |
| 4,023,121 | 5/1977 | Alley, III | 331/111 |
| 4,199,734 | 4/1980 | Dressen | 331/76 |
| 4,272,736 | 6/1981 | Gercekci et al. | 331/108 |
| 4,376,269 | 3/1983 | Forward | 331/117 |
| 4,420,731 | 12/1983 | Schiebold et al. | 333/219 |
| 4,523,158 | 6/1985 | Megeid | 331/55 |
| 4,536,720 | 8/1985 | Cranford, Jr. et al. | 331/57 |
| 4,538,122 | 8/1985 | Szabo et al. | 331/96 |
| 4,599,582 | 7/1986 | Lewis et al. | 331/117 |
| 4,649,354 | 3/1987 | Khanna | 331/99 |

OTHER PUBLICATIONS

James K. Plourde, Chung-Li Ren, "Application of Dielectric Resonators in Microwave Components", IEEE Trans. on Microwave Theory and Techniques, vol. MTT-29, No. 8, Aug. 1981, pp. 754–770.

Primary Examiner—Siegfried H. Grimm
Attorney, Agent, or Firm—Stephen M. Everett

[57] ABSTRACT

A switchable microwave oscillator is disclosed that includes a quenching circuit for switching, attenuating, modulating, or otherwise controlling the output amplitude of frequency-stabilized, transistor-based, microwave-frequency oscillators. The quenching circuit includes a diode that is coupled to the transistor at the same port that reactive feedback is present, and includes diode biasing means for selectively applying a bias voltage to the diode. The quenching circuit selectively diverts some of the current flowing through the transistor of the oscillator to control the output thereof.

14 Claims, 2 Drawing Sheets

SWITCHABLE MICROWAVE OSCILLATOR

BACKGROUND OF THE INVENTION

1. Field of the Invention

This invention relates generally to microwave-frequency oscillators, and relates more particularly to circuitry adapted for switching, attenuating, modulating, or otherwise controlling the output amplitude of microwave-frequency oscillators.

2. Description of the Relevant Art

A typical microwave oscillator includes an active device capable of oscillating at microwave-range frequencies plus associated oscillation-tuning circuitry capable stabilizing the oscillator at a particular frequency. Many microwave-frequency oscillators utilize a bipolar or field-effect transistor as the active device, in which case the oscillator includes bias circuitry that establishes the bias conditions of the transistor and reactive-feedback circuitry that creates, in conjunction with the transistor, a negative resistance that allows the transistor to oscillate. So long as the negative resistance is sufficient, the transistor will oscillate at a frequency dictated by the oscillation-tuning circuitry.

In order to switch some prior art oscillators on and off, common practice was to turn on and off, respectively, the bias circuit. Switching the oscillator in this fashion creates frequency stability problems due to thermal transients related to the transistor cooling when the bias voltage is removed and warming when the bias voltage is reapplied. Alternatively, a shunting circuit attached between the oscillation-tuning circuitry and the transistor could be selectively activated in order to cancel the oscillation condition by perturbing the impedance of the oscillation-tuning circuit.

SUMMARY OF THE INVENTION

In accordance with the illustrated preferred embodiments, the present invention provides circuitry for switching, attenuating, modulating, or otherwise controlling the output amplitude of microwave-frequency oscillators. More specifically, the present invention relates to a quenching circuit for attachment to a transistor-based, frequency-stabilized oscillator. The quenching circuit includes a diode that is coupled to the reactive-feedback port of the transistor, and includes diode biasing means for selectively applying a bias voltage to the diode.

The quenching circuit of the present invention selectively diverts a small amount of the current flowing through the transistor of the oscillator. When the diode is reverse biased, no current is diverted and the oscillator oscillates normally. When the diode is forward biased, a portion of the DC bias current flowing through the transistor is diverted by the diode. If enough current is diverted by the diode, the reactive feedback to the transistor will be insufficient and the transistor will stop oscillating. If a lesser amount of current is diverted by the diode, the oscillator will oscillate, but its output power will be attenuated.

In addition to switching or attenuating the output of a transistor-driven oscillator, the quenching circuit of the present invention can modulate the output of the oscillator. By biasing the diode with an alternating current signal, the output of the oscillator will be modulated at the same frequency.

One feature of the present invention is that the oscillator can be quickly switched on and off without significantly altering the transistor bias conditions. This feature is advantageous in that such switching is fast and that the oscillation frequency is stable. Another feature of the present invention is that the operating point of the oscillating transistor can be controlled and can be adjusted out of the saturation region by partial quenching so that the resulting signal contains less harmonics/subharmonics, spurious signals, and phase noise. A further feature is that the present invention can be utilized in conjunction with either fixed frequency oscillators or broad-band, tunable oscillators. Still another feature of the present invention is that the partial quenching action can be selectively applied to particularly noisy frequencies of a broad-band oscillator to clean up the output signal at those frequencies, but without effecting the output signal at other frequencies.

The present invention can be used to great advantage where a frequency range is needed that is broader than can be obtained with a single tunable oscillator. In the past, multiple tunable oscillators would be coupled to a single-pole, multi-throw switch, so that the output signal of a selected one of the oscillators would be generated upon demand. Such a switch was required to provide very high isolation between the oscillators, and even then, spurious signals were inevitable. Spurious signals could be eliminated if the non-selected oscillators were turned off, but such an approach suffers from slow response. With the present invention, however, multiple tunable oscillators can be easily and quickly switched on and off, thereby eliminating spurious signals but retaining good response. Also, the switch can be much simpler and cheaper since high isolation is no longer required; even a simple, passive power combiner can be used instead of a switch.

The features and advantages described in the specification are not all inclusive, and particularly, many additional features and advantages will be apparent to one of ordinary skill in the art in view of the drawings, specification and claims hereof. Moreover, it should be noted that the language used in the specification has been principally selected for readability and instructional purposes, and may not have been selected to delineate or circumscribe the inventive subject matter, resort to the claims being necessary to determine such inventive subject matter.

DETAILED DESCRIPTION OF THE PREFERRED EMBODIMENT

Figure 1:
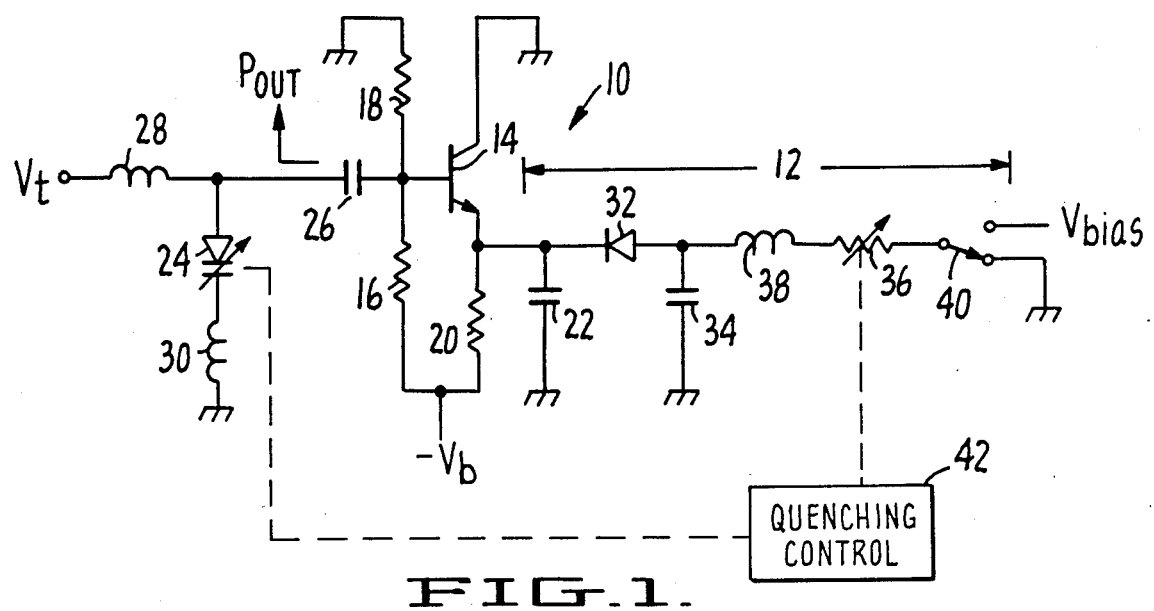
FIG. 1 is a schematic diagram of a switchable microwave oscillator according to the present invention. The oscillator of FIG. 1 utilizes a varactor for frequency tuning.
Figure 2:
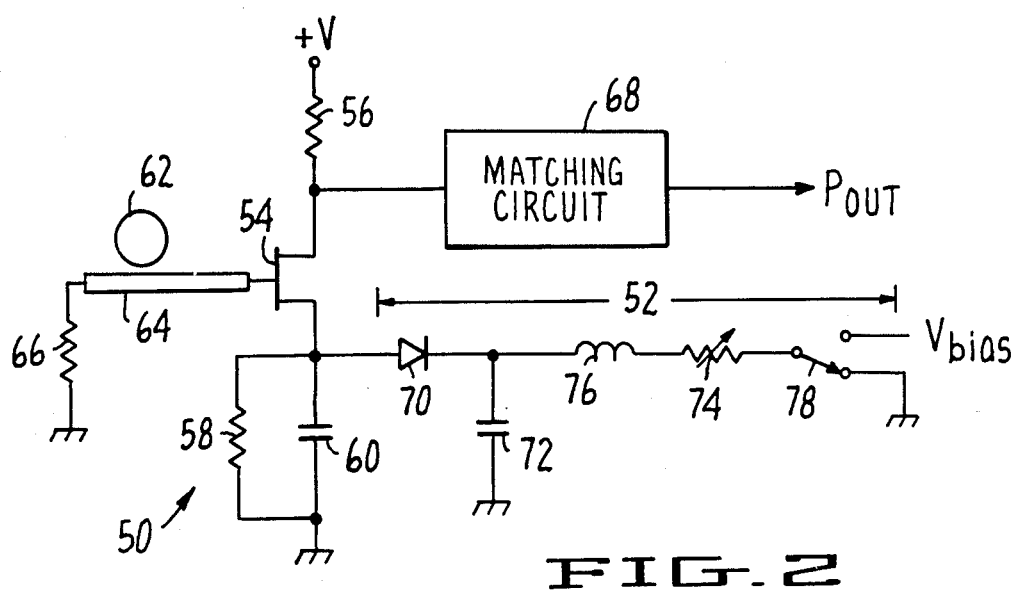
FIG. 2 is a schematic diagram of an alternative embodiment of a switchable microwave oscillator according to the present invention. The oscillator of FIG. 2 utilizes a dielectric resonator for frequency determination.
Figure 3:
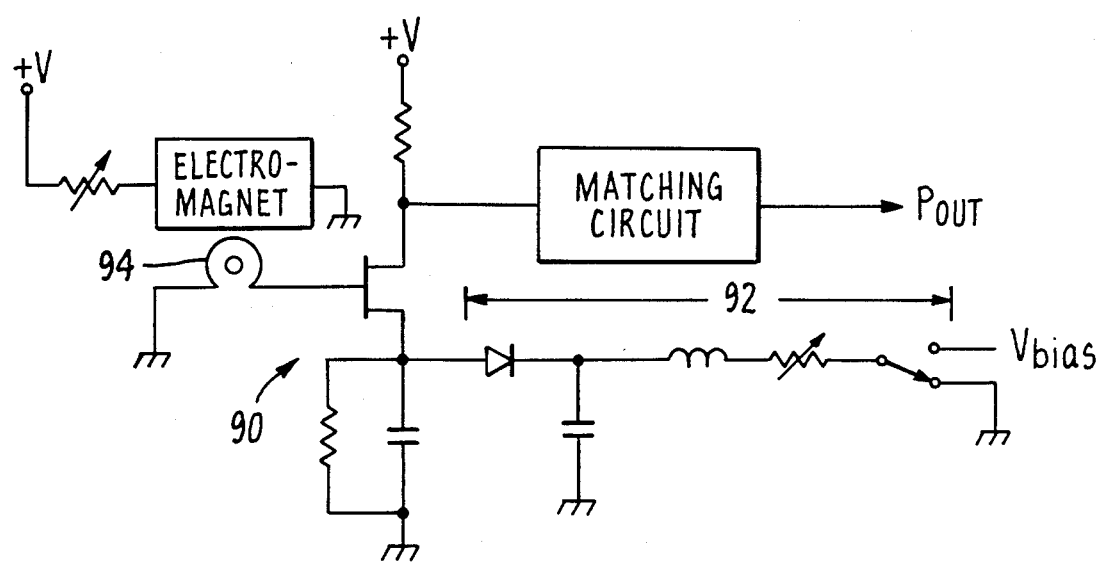
FIG. 3 is a schematic diagram of another alternative embodiment of a switchable microwave oscillator according to the present invention. The oscillator of FIG. 3 is a YIG-tuned oscillator.

FIGS. 1 through 3 of the drawings depict various preferred embodiments of the present invention for purposes of illustration only. One skilled in the art will readily recognize from the following discussion that alternative embodiments of the structures and methods illustrated herein may be employed without departing from the principles of the invention described herein.

The preferred embodiment of the present invention is a switchable, frequency-stabilized, transistor-based, microwave-frequency oscillator that utilizes a novel "quenching" circuit for switching, attenuating, modulating, or otherwise controlling the output amplitude of the oscillator. The term "quenching" is used herein to refer to changing the negative resistance of the oscillator in such a way so that the output amplitude of the oscillator is reduced, including the case where the oscillator stops oscillating.

FIG. 1 illustrates a varactor-tuned oscillator 10 that incorporates the quenching circuit 12 of the present invention. A bipolar transistor 14 is the active device, and is DC biased by a negative voltage, $-V_b$, that is applied to the base of the transistor through a voltage divider consisting of resistors 16 and 18 and applied to the emitter of the transistor through a resistor 20. The collector of the transistor 14 is grounded. A capacitor 22 is connected to the emitter of the transistor to provide reactive feedback to the transistor. The oscillation frequency of the oscillator 10 is stabilized by a varactor 24, which is coupled to the base of transistor 14 through a capacitor 26. The resonant frequency of the varactor 24 can be varied by application of a voltage, $V_t$, which is applied to the anode side of the varactor through an inductor 28. The cathode of the varactor 24 is coupled to ground through another inductor 30. The power output signal of the oscillator 10 is removed from the line connecting the varactor to the transistor through an appropriate coupler.

The quenching circuit 12, includes a diode 32 that is connected at its cathode side to the emitter of transistor 14 and is connected at its anode side to biasing circuitry. The diode biasing circuitry includes a capacitor 34 connected between the anode of diode 32 and ground, and an adjustable resistor 36 and an inductor 38 connected in series between the anode of the diode and a switch 40. The switch 40 can be selectively connected to either ground, which forwardly biases the diode, or to a source of voltage, $V_{bias}$, which in this embodiment is a source of negative voltage of sufficient magnitude to reverse bias the diode 32. The capacitor 34 serves as a bypass capacitor, while the inductor 38 isolates the $V_{bias}$ power supply from the rest of the oscillator 10. The resistor 36 limits the current through the diode 32 when the switch 40 is grounded. The switch 40 is preferably a transistor capable of switching between ground and $V_{bias}$.

When the switch 40 is connected to $V_{bias}$, the diode 32 is reverse biased, which allows the oscillator 10 to oscillate in its normal fashion. When the switch 40 is connected to ground, however, the diode 32 will be forward biased and will reduce the amount of bias current flowing through the transistor 14. If that current is reduced sufficiently, the reactive feedback provided by the capacitor 22 will become insufficient to cause the oscillator to oscillate, in which case the oscillator will cease oscillating. In this case, the quenching circuit 12 is fully quenching the output of the oscillator 10. If the current is reduced by a lesser amount, the oscillator 10 will continue to oscillate but its power output will be attenuated, in which case the quenching circuit is partially quenching the output of the oscillator. When forward biased, the diode 32 acts like an RF resistance to ground in parallel with the reactive feedback element, capacitor 22. The amount of RF resistance contributed by the diode 32 is determined by the current drawn by the diode. An inverse relationship exists between the current and RF resistance of microwave-frequency diodes, with increasing current draw corresponding to decreasing RF resistance. The amount of current drawn by the diode 32 and, consequently, the amount of quenching can be adjusted according to the value of the resistor 36.

In the above description of the quenching circuit, it is assumed that $V_{bias}$ is a constant voltage sufficient to reverse bias the diode 32. If, instead, $V_{bias}$ is an alternating current signal, then the diode 32 is alternately forward and reversed biased. In this case, the quenching circuit 12 acts as a modulator to modulate the output of the oscillator at the frequency of $V_{bias}$.

The tunability of varactor-tuned oscillators permits its use in a variety of circuits where broadband oscillators are needed. With the addition of the quenching circuit of the present invention, the quality of the oscillator output signal in those regions of the frequency band that exhibit excessive harmonics/subharmonics, spurious signals, and phase noise, can be improved by partially quenching the output of the varactor-tuned oscillator when operating within those regions. Selective partial quenching can be accomplished by adding a quenching control circuit 42 that responds to the oscillation frequency selected by the varactor 24 by varying the resistance of resistor 36 according to some function of the oscillation frequency.

The diode 32 of the quenching circuit must satisfy certain requirements. First, and most importantly, the diode 32 must be able to operate within the frequency range of the oscillator. Second, the diode 32 when reverse biased must not unduly load down the oscillator and degrade its performance, which requires a diode having a low capacitance. Third, the RF resistance contributed by the forward-biased diode 32 must be sufficient to obtain the desired quenching of the oscillator output. The diode 32, when forward biased, is preferably less than fully conductive in order to provide the requisite RF resistance.

Diode 32 is preferably a PIN diode, which will operate at microwave frequencies and will not unduly load down the oscillator when switched off. The use of a PIN diode is also preferred because the necessary amount of RF resistance is readily and accurately obtainable with a small current through a PIN diode. A PIN diode having beam leads, such as model number HP4005, available from Hewlett-Packard of Palo Alto, Calif. may be used to minimize the capacitive loading of the diode on the oscillator.

Another embodiment of a switchable microwave-frequency oscillator according to the present invention is illustrated in FIG. 2. Oscillator 50 has a quenching circuit 52 in addition to the standard elements of a dielectric-resonator oscillator.

In oscillator 50, the transistor 54 is a GaAs FET (gallium-arsenide field-effect transistor), which is biased by a positive voltage applied through resistor 56 to the drain and a ground connection coupled through resistor 58 to the source. A capacitor 60 connected to the source of the transistor 54 provides the necessary reactive feedback. The oscillator 50 oscillates at a frequency determined by a dielectric resonator 62, which is coupled through a microstrip line 64 to the gate of the transistor 54. One end of the microstrip line 64 is connected to the gate of the transistor, while the other end is terminated at its characteristic impedance through a resistor 66 to ground. A matching circuit 68 matches the power output signal to the load conditions.

The quenching circuit 52 includes a diode 70 that is connected at its anode side to the source of transistor 54 and is connected at its cathode side to biasing circuitry. The diode biasing circuitry, in turn, includes a capacitor 72 connected between the cathode of diode 70 and ground, and an adjustable resistor 74 and an inductor 76 connected in series between the cathode of the diode and a switch 78. The switch 78 can be selectively connected to either ground or to a source of voltage, $V_{bias}$, which in this embodiment is a source of positive voltage of sufficient magnitude to reverse bias the diode 70. The capacitor 72 serves as a bypass capacitor, while the inductor 76 isolates the $V_{bias}$ power supply from the rest of the oscillator 50. The resistor 74 limits the current through the diode 70 when the switch 78 is grounded. The switch 78 is preferably a transistor capable of switching between ground and $V_{bias}$.

In operation, the quenching circuit 52 allows the oscillator 50 to oscillate normally when the diode 70 is reverse biased, which occurs when the switch 78 is connected to $V_{bias}$. When the diode 70 is instead forward biased by virtue of switch 78 being grounded, then the diode changes the current flow in and through the transistor 54, thus changing the negative resistance of the oscillator and effecting its RF power output. When the diode is forward biased, the output of the oscillator 50 will be attenuated either partially or completely, depending upon the amount of RF resistance associated with the diode, which, once again, is a function of the current flowing through the diode.

Another embodiment of the present invention, a YIG-tuned oscillator 90, is illustrated in FIG. 3. Apart from the tuning element of the oscillator, YIG 94, this embodiment is equivalent to the dielectric resonator-tuned oscillator 50 of FIG. 2. The quenching circuit 92 operates in the same manner as the quenching circuit 52 of oscillator 50. In a YIG-tuned oscillator, partial quenching can help reduce the saturation of the YIG sphere by reducing the power dissipated in the sphere, and, thus, improving the noise performance of the oscillator.

The quenching circuit of the present invention is intended for use in association with microwave-frequency oscillators. Dielectric resonator oscillators, for example, typically operate only in the microwave frequency range, at frequencies equal to or greater than 1.0 GHz, which is the commonly defined lower limit of the microwave frequency range. The quenching circuit may be used at frequencies somewhat below 1.0 GHz where the associated oscillator can oscillate at sub-microwave frequencies. YIG-tuned oscillators can typically operate at frequencies down to 500 MHz, while varactor-tuned oscillators can operate at frequencies down to perhaps 250 MHz. Such oscillators are capable of operation in the microwave frequency range, but have a lower limit below 1.0 GHz. A tunable YIG oscillator, for example, may have a tuning range of 500 MHz to 2.0 GHz. The quenching circuit of the present invention is intended to be used in association with oscillators constructed according to microwave design techniques of circuit layout, biasing, and the use of transmission lines, regardless of the precise lower oscillation limit of such oscillators.

From the above description, it will be apparent that the invention disclosed herein provides novel and advantageous circuitry for switching, attenuating, modulating, or otherwise controlling the output amplitude of microwave-frequency oscillators. The foregoing discussion discloses and describes merely exemplary methods and embodiments of the present invention. As will be understood by those familiar with the art, the invention may be embodied in other specific forms without departing from the spirit or essential characteristics thereof. Oscillator designs other than the particular oscillators disclosed herein will also benefit from the quenching circuit of the present invention. Oscillators having oscillation-tuning circuits other than dielectric resonators, varactors, or YIG's, such as, for example, microstrip resonators, can be controlled with the present invention. In addition, the scope of the invention should not be limited to oscillators having only the biasing circuitry shown in the figures, since other, equivalent biasing circuitry could be used. Accordingly, the disclosure of the present invention is intended to be illustrative, but not limiting, of the scope of the invention, which is set forth in the following claims.

What is claimed is:

1. In a frequency stabilized oscillator having a transistor operable for oscillation in the microwave-frequency range, reactive feedback means coupled to a first port of the transistor for providing sufficient negative resistance to allow the transistor to oscillate, and oscillation-tuning means coupled to a second port of the transistor for stabilizing the oscillation frequency of the oscillator, the improvement comprising:

a quenching circuit coupled to the first port of the transistor and operable for selectively controlling the strength of the output signal of the oscillator, wherein said quenching circuit comprises a diode coupled to the first port of the transistor and diode biasing means for selectively biasing said diode, wherein said diode is operable for reducing the negative resistance of the oscillator when said diode is forward biased.

2. A circuit as recited in claim 1 wherein a first side of said diode is coupled to the transistor, and wherein said diode biasing means includes switching means for selectively coupling a second side of said diode to a first DC voltage source for reverse biasing said diode and to a second DC voltage source for forward biasing said diode.

3. A circuit as recited in claim 2 wherein said diode biasing means further includes a capacitor coupled between the second side of said diode and said second DC voltage source, and includes a resistor and inductor coupled in series between the second side of said diode and said switching means.

4. A circuit as recited in claim 1 wherein said diode biasing means includes means for applying a modulating signal to alternately forward and reverse bias said diode.

5. A circuit as recited in claim 1 wherein said diode biasing means includes means for adjusting the amount of current flowing through said diode when forward biased in order to adjust the amount of negative resistance reduced by said quenching circuit.

6. A circuit as recited in claim 1 wherein said oscillation-tuning means is operable for tuning the output frequency of said oscillator over a frequency band, and wherein said diode biasing means includes means responsive to the oscillation frequency of said oscillator for selectively biasing said diode by an amount that is determined by said oscillation frequency.

7. In a microwave-frequency oscillator having a transistor, transistor biasing means for applying a bias voltage to said transistor, an oscillation-tuning circuit coupled to one port of said transistor, and reactive feedback means coupled to another port of said transistor for generating negative resistance in a desired frequency band to enable said transistor to oscillate at a frequency determined by said oscillation-tuning means, the improvement comprising:
  a diode coupled at a first side thereof to the same port of said transistor as said reactive feedback means is coupled and operable for diverting current away from said transistor biasing means; and
  diode biasing means for selectively applying a bias voltage to a second side of said diode for controlling the amount of current diverted by said diode.

8. An oscillator as recited in claim 7 wherein said diode biasing means includes switching means for selectively coupling the second side of said diode to a first DC voltage source for reverse biasing said diode and to a second DC voltage source for forward biasing said diode, includes a capacitor coupled between the second side of said diode and said second DC voltage source, and includes a resistor and an inductor coupled in series between the second side of said diode and said switching means.

9. A switchable microwave oscillator comprising:
  a transistor capable of oscillation at frequencies in the microwave frequency range;
  transistor biasing means for supplying a bias voltage to said transistor;
  an oscillation-tuning circuit coupled to a first port of said transistor;
  reactive feedback means coupled to a second port of said transistor for providing in combination with said transistor a negative resistance to enable said transistor to oscillate at a frequency determined by said oscillation-tuning circuit;
  a diode coupled to the second port of said transistor in parallel with said reactive feedback means; and
  diode biasing means for selectively applying a bias voltage to said diode.

10. An oscillator as recited in claim 9 wherein said transistor is a GaAs field-effect transistor, said reactive feedback means includes a capacitor coupled between ground and a source terminal of said transistor, wherein one side of said diode is coupled to the source terminal of said transistor, and wherein said diode biasing means is operable for selectively coupling a second side of said diode to ground to forward bias said diode to stop said oscillator from oscillating and for selectively coupling the second side of said diode to a source of voltage sufficient to reverse bias said diode to allow said oscillator to oscillate.

11. An oscillator as recited in claim 9 wherein said transistor is a bipolar transistor, said reactive feedback means includes a capacitor coupled between ground and an emitter terminal of said transistor, wherein one side of said diode is coupled to the emitter terminal of said transistor, and wherein said diode biasing means is operable for selectively coupling a second side of said diode to ground to forward bias said diode to stop said oscillator from oscillating and for selectively coupling the second side of said diode to a source of voltage sufficient to reverse bias said diode to allow said oscillator to oscillate.

12. An oscillator as recited in claim 9 wherein said oscillation-tuning circuit includes a dielectric resonator.

13. An oscillator as recited in claim 9 wherein said oscillation-tuning circuit includes a YIG tuning element.

14. An oscillator as recited in claim 9 wherein said oscillation-tuning circuit includes a varactor.

* * * * *